United States Patent [19]

Seavey, Jr. et al.

[11] 3,982,178

[45] Sept. 21, 1976

[54] METHOD OF DETERMINING ADEQUACY OF SUBSTRATE MEMORY WIRE DURING THE PLATING PROCESS

[75] Inventors: Marden H. Seavey, Jr., Westford; Joseph M. Wyman, Framingham; Emil Toledo, Newton, all of Mass.

[73] Assignee: The United States of America as represented by the Secretary of the Navy, Washington, D.C.

[22] Filed: Jan. 29, 1975

[21] Appl. No.: 545,249

[52] U.S. Cl. .............................. 324/34 R; 29/593; 340/174 PW
[51] Int. Cl.² .......................................... G01R 33/12
[58] Field of Search ................. 324/34 R, 34 MCT; 29/593; 340/174 PW, 174 TC

[56] References Cited
UNITED STATES PATENTS

| | | | |
|---|---|---|---|
| 3,736,499 | 5/1973 | Major et al. | 340/174 TC |
| 3,853,717 | 12/1974 | Diguilio | 340/174 PW |

*Primary Examiner*—Robert J. Corcoran
*Attorney, Agent, or Firm*—R. S. Sciascia; L. I. Shrago; C. E. Vautrain, Jr.

[57] ABSTRACT

A number of magnetic and memory signatures are developed for defining the adequacy of a coated substrate for memory wire applications. The signatures are determined from sets of films on substrates which characterize good wire and can be used to separate the marginally good from the marginally poor substrate by applying tests at selected steps in the processing of newly coated wire. Separate signatures are established by omitting steps or varying combinations of steps in conventional plating processes and then measuring the magnetic or memory properties from section to section or from bit to bit along the wire.

8 Claims, No Drawings

METHOD OF DETERMINING ADEQUACY OF SUBSTRATE MEMORY WIRE DURING THE PLATING PROCESS

This invention concerns coated substrate wire testing and, more particularly, a method of testing such wire for adequacy of the substrate for memory wire applications before the wire is fully plated.

Magnetic wire is fabricated by plating a thin permalloy film on a beryllium copper core wire plated with pure copper. The final memory properties of the film are very sensitive to the properties of the wire core. However, attempts to distinguish good wire from bad wire by defining raw wire properties have failed because it is possible for both good and bad to meet wire specifications. Currently, the primary test used to establish the adequacy of raw wire spool involves plating memory wire with both copper plating stages off, i.e. plating with permalloy only, and examining the magnetic properties of the wire on a Belson tester for skew, dispersion and squareness of the Belson loop and consistency of the properties from bit to bit and between wire made on adjacent lines. It has been observed that good wire has not yet been produced from raw wire without electropolishing. The method of using actual process operational results to define good wire also is inadequate since there are a large number of non-substrate related variables in any process which influence appreciably end product quality and yield. For example, a poorly adjusted permalloy bath will produce poor memory wire even on the best spool of substrate while a poor spool of substrate can result in the production of poor memory wire even with a perfectly adjusted process.

The method of the present invention overcomes the above problems and other deficiencies of present approaches to distinguishing good wire from bad by establishing magnetic and memory signatures of various magnetic films on smooth, moderately rough and rough copper coated substrate wire. These signatures define the adequacy of the substrate and prevent waste of operators' time and misadjustment further along of the process line because of poor substrate. The method comprises establishing a full set of specific magnetic and memory properties of the films in the form of signatures which characterize a given good wire, the signatures being taken of substrates of known good quality and plated in alternate series of steps. The substrates are tested at each step to obtain reference values or signatures, and these values are then compared with instantaneous values taken at selected steps in the processing of newly coated substrates. The method avoids having to test raw wire substrates. The signatures can be used to separate marginally good from marginally poor substrate wire so that the clearly good or clearly bad can be readily identified by the very high or very low quality of certain ones of the signatures.

Accordingly, it is an object of the present invention to provide a method of testing substrate memory wire before it is fully plated.

Another object of this invention is to provide a method of establishing magnetic signatures for substrate memory wire which can be used to define the adequacy of the substrate for memory wire applications.

Other objects, advantages and novel features of the invention will become apparent from the following detailed description thereof.

Although the following description of the invention is directed to a particular process for fabricating magnetic memory wire, it will be appreciated that the method is applicable to any similar process in which a full set of magnetic signatures for a base element are utilized to determine suitability before the element is fully coated or otherwise finished.

The variables having a major effect on the end raw wire product are line tension and drive mechanisms, raw wire characteristics, electropolishing stage, copper plating stage, permalloy 1 plating, permalloy 2 plating, and magnetic heat treatment. Raw wire also possesses such variables as surface topography, surface chemistry and microstructure, core chemistry and microstructure, extent and distribution of various phases, size and distribution of defects, and size and distribution of contaminants.

The present invention is directed to obtaining memory and magnetic signatures between various processing stages in which moderately rough copper or electropolishing are first applied or performed on the raw wire and thereafter various combinations of fully rough copper and/or permalloy 1 and permalloy 2 are coated on the partially processed wire. Permalloy 1 is a conventional magnetic film comprising 77 percent nickel, 3.5 percent cobalt and 19.5 percent iron. Permalloy 2 is a conventional magnetic film comprising 80.5 percent nickel, 19.5 percent iron and a trace of cobalt. Magnetic or memory properties are measured thereafter from section to section or from bit to bit along the wire.

The particular processes selected in this embodiment to define the memory and magnetic signatures are (1) permalloy 1 on copper 1, moderately rough copper, (2) permalloy 1 on copper 1 and copper 2, fully rough copper, (3) permalloy 2 on copper 1, (4) permalloy 2 on copper 1 and copper 2, (5) permalloy 1 and permalloy 2 on electropolishing, (6) permalloy 1 and permalloy 2 on copper 1, and (7) permalloy 1 and permalloy 2 on copper 1 and copper 2.

In process (1), permalloy 1 only is plated on copper from the copper 1 cell only — the permalloy 2 and copper 2 cells are turned off. In this process, a film of about half the final thickness is plated onto only moderately rough copper.

In process (2), the copper 2 cell is turned on and permalloy 1 only is plated onto the fully rough copper.

Processes (3) and (4) repeat processes (1) and (2) for permalloy 2 instead of the permalloy 1.

Process (5) plates the complete film directly onto the electropolished substrate, both coppers 1 and 2 are off.

Process (6) plates the complete film onto the moderately rough copper.

In process (7), the complete memory film is produced.

The process (7) signature serves as a final check on the substrate quality and, if all other signatures are good, a good signature in process (7) means that normal production may begin with no time lost in line readjustments.

An eighth process, permalloy 1 and permalloy 2 onto the raw substrate, i.e. with no electropolishing, may be employed, but may not be desirable since only rarely do post-electropolishing spools have magnetic signatures no better or even poorer than the raw, pre-electropolishing spools. When such a situation does occur, the spool is clearly defective, probably exhibits surface silicone or organic contamination problems, and can be immediately rejected. Such a poor quality spool will show up in terms of clearly defective magnetic signatures in any of the processes listed above and hence the eighth process is not needed.

The memory element of the coated substrate wire consists essentially of two permalloy films formed in separate plating baths. Permalloy film 1 is made to have slightly negative magnetostriction and permalloy film 2 is adjusted to have slightly positive magnetostriction. Although zero magnetostriction is theoretically the optimum, the slightly positive and slightly negative variations have been found to result in better dispersion and consequently higher outputs at no sacrifice in operating range. The permalloy plating stages are carefully controlled and preferably are monitored daily for specific gravity, pH and ferrous iron and twice weekly for nickel content. In the plating process, burst read is very sensitive to the thickness to the permalloy film and it has been found that currents adjusted to provide $\phi_{max}$ for permalloy 1 of 0.8 and for permalloy 2 of 2.0 for a total $\phi_{max}$ of substantially 2.8 provide optimum results. Iron is added to each bath to produce the desired magnetostriction and cobalt is added as required to permalloy 1 to produce the desired retentivity. After adjustment of magnetic properties, memory properties are developed by the addition of a selected amount of saccharin to produce the desired memory properties. Too little saccharin makes wire difficult to write into and too much saccharin reduces the coercivity, Hc, and makes wire very digit disturb sensitive. Fresh permalloy solutions sometimes are adjusted over a period of 2 to 3 days as chemicals are added slowly and all fresh solutions are made with slightly low quantities of iron, saccharin and cobalt.

The two permalloy stages introduce 21 variables into the overall process, 11 for permalloy 1 and 10 for permalloy 2. The four variables adjusted in the processes for permalloy 1 and permalloy 2 are nickel, iron, saccharin and current. In addition, cobalt in permalloy 1 is used to control retentivity.

Of the 46 variables which are present in the overall process, 5 are varied to produce good wire and 14 are varied to control the end product properties. The 14 variables and controls are specific gravity, copper concentration from 50 to 90 gm/liter, copper current from 125 to 225 ma, cobalt bromide in permalloy 1 of 30 to 60 gms, iron in permalloy 1 and permalloy 2 are adjusted for zero magnetostriction, nickel in permalloy 1 and permalloy 2 are adjusted for zero magnetostriction, saccharin in permalloy 1 and permalloy 2 of 1 to 3 gms, plating current in permalloy 1 of 45 to 65 and in permalloy 2 of 55 to 75 in a orienting current of 600 to 800 ma, and skew control current during annealing varied from 0 to 1 amp to produce zero skew wire.

The magnetic and memory properties are measured with a $\phi$-H plotter, a Belson tester, a parameter tester, and on-line memory tester.

The $\phi$-H plotter is basically a hard axis hysteresis loop plotter. A pattern of narrow word pulses — 100ns rise time, 2 $\mu$s width — of linearly increasing amplitude relative to a large negative dc hard axis bias field is employed, and the integrated flux outputs from a 180 mil wire section having 5 to 10 individual memory bits displayed. The saturation output flux $\phi_{max}$, the average anisotropy field $H_k$, and the tension sensitivity $\delta H_k/\delta T$ are obtained from the display. The wire film thickness is directly proportional to $\phi_{max}$; the cobalt-saccharin balance, as well as surface roughness to a small extent, effects $H_k$; and the tensional magnetostriction is minimized for minimal $\delta H_k/\delta T$.

The Belson tester gives information on the film switching curve for constant word current and variable bit current. Word current pulses of 5.6 oe amplitude, i.e. a 100 kHz repetition rate, are applied to a 945 mil section of wire having 25 to 50 individual memory bits in the presence of 60 Hz bit current sweeps of either 2.0 oersteds or 12.0 oersteds peak to peak. From the displayed Belson loop the retentivity $\eta$, the dispersion $\alpha$, the skew $\beta$, and the torsion sensitivity $\delta\beta/\delta\tau$ are obtained. The width of the switching curve for 50 per cent flux switch at 5.6 oersteds word field is given by $\eta$, the thickness of the switching curve at 5.6 oersteds word field, related to the so-called dispersion of the anisotropy, is given by $\alpha$, the small component of induced anisotropy field along the hard direction, the wire axis, is given by $\beta$, and the torsional magnetostriction is proportional to $\delta\beta/\delta\tau$. The cobalt-saccharin balance as well as the surface roughness greatly effect $\eta$ and $\alpha$, the on-line skew adjustment coil is used to minimize $\beta$, and the torsional magnetostriction is minimized for minimal $\delta\beta/\delta\tau$.

The parameter tester gives information on the film switching curve for constant bit current and variable word current, and is an extremely sensitive indicator of skew. Repetitive word current pulse ramps, having 0 to 9 oe peak in each ramp, with digit current pulses of constant amplitude but alternating polarity from ramp to ramp are applied to a 945 mil section of wire. The digit current amplitude is varied until the 50 per cent flux switch falls at the 7.5 oe word field, 7 cm on the scope. This digit current amplitude is known as the $I_d$-number and is a measure of the width of the switching curve at the 7.6 oe word field. The effective skew $S_k$ is determined from the separation of the two points of 50 per cent flux switch for the two digit current polarities. The parameter tester is a more sensitive indicator of true skew $\beta$ for small values of $\beta$ than the Belson tester because $S_k$ is measured in the word dimension where the switching curve rises very steeply at low digit currents.

The on-line memory tester measures the wire output voltage $V_o$ from bit to bit with no disturbances present in this application. The tester is thus a sensitive indicator of fine scale substrate inhomogeneity and gives information on the probability dropouts.

The above four testers provide measurements of ten basic magneto/memory properties: $\phi_{max}$, $H_k$, $\delta H_k/\delta T$, $\eta$, $\alpha$, $\beta$, $\delta\beta/\delta\tau$, $I_d$, $S_k$, $V_o$. The acceptable ranges of these properties for each of the seven wire processes are given in the following table:

TABLE I

MAGNETIC PROPERTY RANGES IN SUBSTRATE EVALUATION PROCESSES FOR TYPICAL BIFILM WIRE

| Process: | | | $P_1$ on $C_1$ | $P_1$ on $C_1+C_2$ | $P_2$ on $C_1$ | $P_2$ on $C_1+C_2$ | $P_1+P_2$ on EP | $P_1+P_2$ on $C_1$ | $P_1+P_2$ on $C_1+C_2$ |
|---|---|---|---|---|---|---|---|---|---|
| Saturation Flux | $\phi_{max}$ | mV | 55–65 | 45–55 | 75–85 | 65–75 | 150–170 | 135–145 | 125–135 |
| Anisotropy | $H_k$ | oe | 9–11 | 11–13 | 2.8–3.0 | 2.9–3.1 | 3.2–3.6 | 4.3–4.7 | 4.5–4.9 |
| Tension Sensitivity | $\frac{\delta H_k}{\delta T}$ | oe gm | (−.020)– (−.030)– | .00– ±.01 | (−.015)– (−.025) | .00– ±.01 | (−.08)– (−.12) | (−.020)– (−.030) | .00– ±.01 |
| Retentivity | $\eta$ | oe | — | — | 2.9–3.3 | 3.2–3.6 | .15–.25 | 0.9–1.1 | 1.1–1.3 |
| Dispersion | $\alpha$ | oe | — | — | 1.6–2.0 | 1.7–2.1 | .06–.10 | .27–.33 | .32–.38 |
| Skew | $\beta$ | oe | — | — | .00–±.03 | .00–±.03 | ±.20–±.25 | .00–±.03 | .00–±.03 |
| Torsion Sensitivity | $\frac{\delta\beta}{\delta\tau}$ | oe.in 10 deg | — | — | .30–.40 | .00–±.15 | 1.2–1.8 | .35–.45 | .00–±.15 |
| Id-number | $I_d$ | ma | — | — | 30–40 | 40–50 | — | 12–14 | 14–16 |
| Skew | $S_k$ | cm | — | — | .0–.5 | .0–.5 | — | .0–.5 | .0–.5 |
| Output | $V_o$ | mV | — | — | — | — | DRO | 12–14 | 10–12 |
| Skew Control Coil | | | OFF | OFF | ON | ON | OFF | ON | ON |

The section to section or bit to bit variations in the properties as the wire is moved should fall within the ranges shown in the table. In the substrate testing procedure, the processes are performed in order from (1) to (7). Processes (1) and (2), permalloy 1 on moderately rough and rough copper, give limited substrate information, unless the substrate is very poor, but are necessary in order to insure a balanced, uncontaminated permalloy 1. Omission of these process steps could result in a misinterpretation of problems as due to the substrate in processes (5), (6) or (7) when in fact they were actually caused by problems in the permalloy 1. It should be noted that the $\phi_{max}$ values are relatively small and the $H_k$ values large compared to the process (3) and (4) films of equal thickness. This is because of the relatively large amount of cobalt, approximately 4 per cent, in the permalloy 1. The switching thresholds are so large due to the large anisotropy caused by the cobalt, that neither the Belson tester nor the parameter tester can be used. The cobalt-saccharin and nickel-iron balance are adjusted to keep the $\phi$-H plotter properties in the ranges shown. With the proper balance, the tension magnetostriction, which is proportional to minus $\delta H_k/\delta T$, is slightly positive in the iron rich process (1) and is close to zero on the rough substrate, which favors nickel, in process (2).

Processes (3) and (4), permalloy 2 on moderately rough and rough copper, are more sensitive indicators of substrate problems. The relatively small amount of cobalt, less the 0.3 per cent, in the permalloy 2 and the correspondingly low anisotropy permit measurement of all magnetic properties — not just the $\phi$-H plotter properties as in processes (1) and (2) — on a film of about one-half the final thickness. The low film thickness means that the substrate is more effectively sensed because the leveling action of the saccharin is less pronounced. As in processes (1) and (2), the nickel-iron balance must be adjusted for zero magnetostriction. Also, the retentivity and dispersion, $\eta$ and $\alpha$, although at least measurable compared to the permalloy 1 processes, are much larger than in the case of the complete film processes (5) and (7). This again is a consequence of the small amount of cobalt and low film thickness.

Finally, the skew control coil is turned on for these processes and the films adjusted for skew $\beta$ less than 0.030 oersteds. The skew at this level is more easily read on the parameter tester when as $S_k$ of 0.5 cm corresponds to about 0.030 oersteds digit field in most films. Very fine scale variations in skew from section to section along the wire can be detected by monitoring $S_k$.

Process (5), the full permalloy film plated onto the electropolished substrate, provides a coarse but direct indication of the directional properties and surface imperfections of the substrate wire. Note that the magnetic properties, with the exception of $H_k$, differ markedly from the other films: $\eta$ and $\alpha$ are much smaller while $\beta$, $\delta H_k/\delta T$, and $\delta\beta/\delta\tau$ are much larger. This is a consequence of the substrate smoothness of process (5). The small $\eta$ value means that the film is essentially DRO and the on-line test cannot be used. A variation of $\beta$ out of the range shown in Table I indicates poor direction properties of wire, while too large fluctuations in $\eta$ and $\alpha$ are more indicative of excessive surface imperfections. The tension and torsion sensitivities relate both to the directional and surface properties of the wire.

Process (6), the full permalloy film on only moderately rough copper, is the best process for examining the fine scale substrate homogeneity because the on-line tester can be used to study the wire on a bit by bit basis. The amplitude, $V_o$, should be extremely stable in the 12–14 millivolt range to define good wire.

The Belson loop in process (6) should be squarer with slightly smaller $\eta$ and $\alpha$ than in the case of the complete memory element of process (7). The other properties, i.e. $\phi_{max}$, $H_k$, $I_d$, and $V_o$ should differ slightly too from the final process film. These differences should reflect only the difference in surface roughness between processes (6) and (7) for this bifilm. When the other magnetic signatures are good, deviations from these specific changes from processes (6) to (7) are indicative of very subtle effects. Careful comparison of processes (6) and (7) results, then, can be used to separate marginally good from marginally poor substrate, a task that would be virtually impossible by any other method.

The present invention, as described in relation to the sequential magnetic analysis of typical bifilm process steps, thus is a valuable tool for defining substrate quality. It is noted that although the numbers given in Table I apply to specific bifilm wire, the invention is applicable to other wires when minor adjustments for somewhat different modifications of the basic bifilm process are made. That is, a general procedure of substrate evaluation has been presented which is applicable to quite different film processes such as the mono-film process subject to minor changes in implementation of the process.

What is claimed is:

1. A method of evaluating memory wire substrates during plating processing to determine adequacy for memory wire applications comprising:
   plating reference memory wire substrates of known good quality in a sequence of selected plating process solutions and performing selected tests after the processing step of each solution;
   determining the acceptable ranges of properties at each selected test is performed;
   plating new memory wire substrates in a like sequence of solutions; and
   testing said new wire substrates after selected plating steps to determine those substrates having properties lying within said acceptable ranges.

2. The method of claim 1 wherein said specific properties are saturation output flux $\phi_{max}$, average anisotropy field $H_k$, tension sensitivity $\delta H_k/\delta T$, retentivity $\eta$, dispersion $\alpha$, skew $\beta$, torsion sensitivity $\delta\beta/\delta T$, digit current amplitude $I_d$, effective skew $S_k$, and output voltage $V_o$.

3. The method of claim 2 wherein the processing steps in preparing said wire substrates are:
   1. plating a memory element of permalloy 1 on moderately rough copper on electropolished raw wire;
   2. plating a memory element of permalloy 1 on fully rough copper on electropolished raw wire;
   3. plating a memory element of permalloy 2 on moderately rough copper on electropolished raw wire,
   4. plating a memory element of permalloy 2 on fully rough copper on electropolished raw wire,
   5. plating memory elements of permalloy 2 on permalloy 1 on electropolished raw wire,
   6. plating memory elements of permalloy 2 on permalloy 1 on moderately rough copper on electropolished raw wire, and
   7. plating memory elements of permalloy 2 on permalloy 1 on fully rough copper on electropolished raw wire.

4. The method of claim 3 wherein values of $\phi_{max}$, $H_k$ and $\delta H_k/\delta T$ are obtained from the display of a hard axis hystersis loop plotter and wherein film thickness is directly proportional to $\phi_{max}$.

5. The method of claim 4 wherein values of $\eta$, $\alpha$ and $\delta\beta/\delta\tau$ are obtained from film switching curve for constant word current and variable bit current,
   said film switching curve derived by applying word current pulses of substantially 5.6 oe amplitude to a 945 mil section of wire having from on the order of 25 to 50 individual memory bits in the presence of 60 $H_z$ bit current sweep of 2 oe or 12 oe peak to peak.

6. The method of claim 5 wherein the value of $\beta$ is obtained from a film switching curve for constant bit current and variable word current,
   said last mentioned film switching curve derived by applying repetitive word current pulse ramps having from 0 to 9 oe peaks in each ramp and digit current pulses of constant amplitude with polarity alternating from ramp to ramp to a 945 mil section wire,
   the value of $S_k$ derives from the separation of two points of 50 per cent flux switch for said two digit current polarities,
   the value of $V_o$ determined by on-line measurement of wire output voltage from bit to bit.

7. The method of claim 6 wherein useable substrates are determined from process (1) by values of $\phi_{max}$ in the range of from 55–65 mv, $H_k$ in the range of from 9–11 oe, and $\delta H_k/\delta T$, in the range of from −0.020 to −0.030 oe/gm,
   from process (2) by values of $\phi_{max}$ in the range of from 45 to 55 mv, $H_k$ in the range of from 11 to 13 oe, and $\delta H_k/\delta T$, in the range of from zero to ±0.01 oe/gm,
   from process (5) by values of $\phi_{max}$ in the range of from 150 to 170 mv, $H_k$ in the range of from 3.2 to 3.5 oe, $\delta H_k/\delta T$, in the range of from −0.08 to −0.12 oe/gm, $\eta$ in the range of from 0.15 to 0.25 oe, $\alpha$ in the range of from 0.06 to 0.10 oe, $\beta$ in the range of from ±0.25 oe, and $\delta\beta/\delta\tau$ in the range of from 1.2 to 1.8 oe-in./10 deg.

8. The method of claim 7 and further including determination of substrate acceptability from process (6) by values of $\phi_{max}$ in the range of from 135 to 145 mv, $H_k$ in the range of from 4.3 to 4.7 oe, $\delta H_k/\delta T$ in the range of from zero to ±0.01 oe/gm, $\eta$ in the range of from 1.1 to 1.3 oe, $\alpha$ in the range of from 0.32 to 0.38 oe, $\beta$ in the range of from zero to ±0.03 oe, $\delta\beta/\delta\tau$ in the range of from zero to ±0.15 oe-in./10 deg., digit current amplitude in the range of from 14 to 16 ma, $S_k$ in the range of from zero to 0.5 cm, and $V_o$ in the range of from 10 to 12 mv.

* * * * *